United States Patent
Watanabe et al.

(10) Patent No.: US 10,852,368 B2
(45) Date of Patent: Dec. 1, 2020

(54) MAGNETIC SENSOR DEVICE

(71) Applicant: TDK CORPORATION, Tokyo (JP)

(72) Inventors: Kazuya Watanabe, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 153 days.

(21) Appl. No.: 16/145,867

(22) Filed: Sep. 28, 2018

(65) Prior Publication Data
US 2019/0293734 A1 Sep. 26, 2019

(30) Foreign Application Priority Data
Mar. 22, 2018 (JP) .................. 2018-054091

(51) Int. Cl.
| | |
|---|---|
| *G01R 33/09* | (2006.01) |
| *B82Y 25/00* | (2011.01) |
| *G01R 33/02* | (2006.01) |
| *H01F 1/12* | (2006.01) |
| *H01L 43/08* | (2006.01) |

(52) U.S. Cl.
CPC .......... *G01R 33/091* (2013.01); *B82Y 25/00* (2013.01); *G01R 33/0206* (2013.01); *G01R 33/093* (2013.01); *H01F 1/12* (2013.01); *H01L 43/08* (2013.01)

(58) Field of Classification Search
CPC .......... G01R 33/093; H01L 43/08; H01F 1/12
See application file for complete search history.

(56) References Cited

U.S. PATENT DOCUMENTS

| | | | | |
|---|---|---|---|---|
| 9,530,957 | B2 | 12/2016 | Sugihara et al. | |
| 2004/0145836 | A1* | 7/2004 | Kojima ................ | G11B 5/3903 360/324.12 |
| 2004/0174740 | A1* | 9/2004 | Lee ....................... | H01L 43/08 365/171 |
| 2004/0190206 | A1* | 9/2004 | Ookawa ............... | B82Y 25/00 360/324.12 |
| 2007/0080384 | A1* | 4/2007 | Noh ..................... | G11C 13/0004 257/295 |
| 2007/0229067 | A1* | 10/2007 | Sasaki .................. | G01R 33/093 324/252 |
| 2008/0054895 | A1* | 3/2008 | Sasaki .................. | B82Y 25/00 324/252 |

* cited by examiner

*Primary Examiner* — Alvaro E Fortich
(74) *Attorney, Agent, or Firm* — Oliff PLC

(57) ABSTRACT

A magnetic sensor device includes a first magnetic sensor, a second magnetic sensor, and a soft magnetic structure. The first magnetic sensor generates a detection value corresponding to a component in a direction parallel to an X direction of an external magnetic field. The second magnetic sensor generates a detection value corresponding to a component in a direction parallel to a Y direction of the external magnetic field. In the presence of a residual magnetization in the X direction in the soft magnetic structure, a magnetic field that is based on the residual magnetization and contains a component in the −X direction is applied to the first magnetic sensor. In the presence of a residual magnetization in the Y direction in the soft magnetic structure, a magnetic field that is based on the residual magnetization and contains a component in the −Y direction is applied to the second magnetic sensor.

9 Claims, 11 Drawing Sheets

MAGNETIC SENSOR DEVICE

BACKGROUND OF THE INVENTION

1. Field of the Invention

The present invention relates to a magnetic sensor device including a magnetic sensor and a soft magnetic structure.

2. Description of the Related Art

Magnetic sensors have been used for a variety of purposes. Some known magnetic sensors use a plurality of magnetic detection elements provided on a substrate. Examples of the magnetic detection elements include magnetoresistive elements.

U.S. Pat. No. 9,530,957 B2 discloses a geomagnetic sensor in which an X-axis magnetic sensor, a Y-axis magnetic sensor, and a Z-axis magnetic sensor are provided on a base. In this geomagnetic sensor, the Z-axis magnetic sensor includes magnetoresistive elements and soft magnetic bodies. The soft magnetic bodies convert vertical magnetic field components, which are in a direction parallel to the Z-axis, into horizontal magnetic field components in a direction perpendicular to the Z-axis, and supply the horizontal magnetic field components to the magnetoresistive elements.

For the conventional magnetic sensors that use magnetic detection elements including magnetic layers, such as magnetoresistive elements, there is a problem that detection values generated by the magnetic sensors exhibit a hysteresis property resulting from a magnetic hysteresis property of the magnetic layers, and the accuracy of detection is thus degraded. This problem will be discussed in detail below. When a magnetic layer included in a magnetic detection element has a magnetic hysteresis property, once the magnetic layer has been magnetized by application of an external magnetic field, magnetization of a certain magnitude remains in the magnetic layer even after the external magnetic field becomes zero. Due to the magnetization remaining in the magnetic layer, a detection value that the magnetic sensor generates when the external magnetic field is zero differs from an ideal value. Further, the direction and magnitude of the magnetization remaining in the magnetic layer when the external magnetic field has become zero vary depending on the direction and magnitude of the external magnetic field before it has become zero. Accordingly, the detection value that the magnetic sensor generates when the external magnetic field has become zero varies depending on the direction and magnitude of the external magnetic field before it has become zero. In this way, a hysteresis property of the detection value results.

SUMMARY OF THE INVENTION

It is an object of the present invention to provide a magnetic sensor device capable of preventing its detection accuracy from being reduced due to a hysteresis property of the detection value.

A magnetic sensor device of the present invention includes at least one first-type magnetic sensor, and a soft magnetic structure formed of a soft magnetic material. The at least one first-type magnetic sensor includes at least one magnetic detection element and is configured to generate a detection value corresponding to an external magnetic field.

The soft magnetic structure has such a magnetic property that a hysteresis loop of its magnetization with varying external magnetic field indicates a residual magnetization. The at least one first-type magnetic sensor and the soft magnetic structure are configured so that in the presence of the residual magnetization in the soft magnetic structure, a magnetic field based on the residual magnetization is applied to the at least one first-type magnetic sensor.

The at least one first-type magnetic sensor, when used by itself, exhibits such a property that in a hysteresis loop of the detection value with varying external magnetic field, the detection value when the external magnetic field is zero is different from an ideal value by a first value other than zero. The at least one first-type magnetic sensor, when used in the magnetic sensor device, exhibits such a property that in a hysteresis loop of the detection value with varying external magnetic field, the detection value when the external magnetic field is zero is different from the ideal value by a second value. The second value is smaller in absolute value than the first value.

In the magnetic sensor device of the present invention, the at least one first-type magnetic sensor may be configured to generate a detection value corresponding to a first component of the external magnetic field, the first component being in a direction parallel to a first direction. In such a case, the at least one first-type magnetic sensor and the soft magnetic structure may be aligned in a direction intersecting the first direction.

In the magnetic sensor device of the present invention, the magnetic field based on the residual magnetization applied to the at least one first-type magnetic sensor may contain a component in a direction opposite to the direction of the residual magnetization.

In the magnetic sensor device of the present invention, the at least one magnetic detection element may include at least one magnetic layer.

In the magnetic sensor device of the present invention, the at least one first-type magnetic sensor may be a first magnetic sensor configured to generate a detection value corresponding to a first component of the external magnetic field, and a second magnetic sensor configured to generate a detection value corresponding to a second component of the external magnetic field, the first component being in a direction parallel to a first direction, the second component being in a direction parallel to a second direction. The first direction and the second direction are orthogonal to each other. The magnetic sensor device may further include a support for supporting the first and second magnetic sensors and the soft magnetic structure. The support may have a reference plane parallel to the first and second directions. The reference plane may include a first region, a second region, and a third region different from each other. The first region is a region formed by vertically projecting the first magnetic sensor onto the reference plane. The second region is a region formed by vertically projecting the second magnetic sensor onto the reference plane. The third region a region formed by vertically projecting the soft magnetic structure onto the reference plane. At least part of the first region may be located to be intersected by a first straight line, and at least part of the second region may be located to be intersected by a second straight line, the first straight line and the second straight line being two mutually orthogonal straight lines lying in the reference plane and passing through the centroid of the third region. The first straight line may be parallel to the second direction.

No portion of the first region may be intersected by the second straight line, and no portion of the second region may be intersected by the first straight line.

The magnetic sensor device may further include a second-type magnetic sensor for detecting a third component of the external magnetic field, the third component being in a direction parallel to a third direction. The third direction is orthogonal to the first direction and the second direction. In this case, the soft magnetic structure may include a magnetic-field conversion section configured to receive the third component of the external magnetic field and output an output magnetic field component, the output magnetic field component being in a direction perpendicular to the third direction. The output magnetic field component may have a strength having a correspondence with the strength of the third component of the external magnetic field. The second-type magnetic sensor ay be configured to detect the strength of the output magnetic field component.

The soft magnetic structure may further include at least one soft magnetic layer.

The support may include a substrate having a top surface. The first and second magnetic sensors, the second-type magnetic sensor, and the soft magnetic structure may be disposed on or above the top surface of the substrate. The reference plane may be the top surface of the substrate.

By virtue of the provision of the at least one first-type magnetic sensor and the soft magnetic structure defined as above, the magnetic sensor device of the present invention is capable of preventing its detection accuracy from being reduced due to a hysteresis property of the detection value.

Other and further objects, features and advantages of the present invention will appear more fully from the following description.

DETAILED DESCRIPTION OF THE PREFERRED EMBODIMENT

Figure 1:
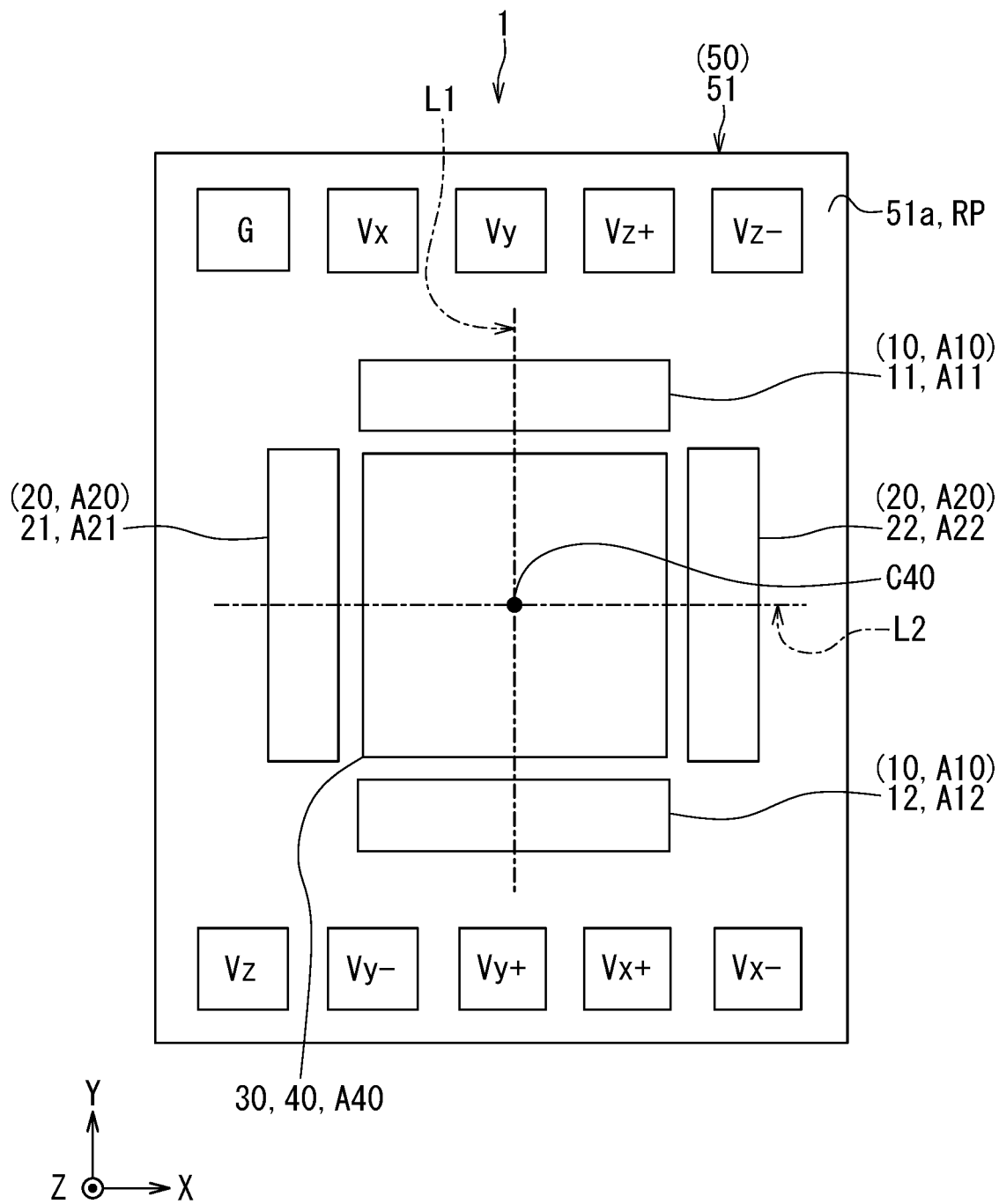
FIG. 1 is a plan view illustrating the general configuration of a magnetic sensor device according to an embodiment of the invention.

A preferred embodiment of the present invention will now be described in detail with reference to the drawings. First, reference is made to FIG. 1 to describe the general configuration of a magnetic sensor device according to the embodiment of the invention. The magnetic sensor device 1 according to the embodiment is a device for detecting components of an external magnetic field that are in three mutually orthogonal directions.

The magnetic sensor device 1 includes at least one first-type magnetic sensor. The at least one first-type magnetic sensor includes at least one magnetic detection element, and is configured to generate a detection value corresponding to an external magnetic field. The at least one magnetic detection element includes at least one magnetic layer. In this embodiment, the at least one first-type magnetic sensor is a first magnetic sensor 10 and a second magnetic sensor 20. The first magnetic sensor 10 is configured to generate a detection value corresponding to a component of an external magnetic field, the component being in a direction parallel to a first direction. The second magnetic layer 20 is configured to generate a detection value corresponding to a component of the external magnetic field, the component being in a direction parallel to a second direction. The first direction and the second direction are orthogonal to each other.

The magnetic sensor device 1 further includes a third magnetic sensor 30. The third magnetic sensor 30 is a second-type magnetic sensor for detecting a component of the external magnetic field, the component being in a direction parallel to a third direction. The third magnetic sensor 30 includes at least one magnetic detection element. The third direction is orthogonal to the first direction and the second direction.

Figure 8:
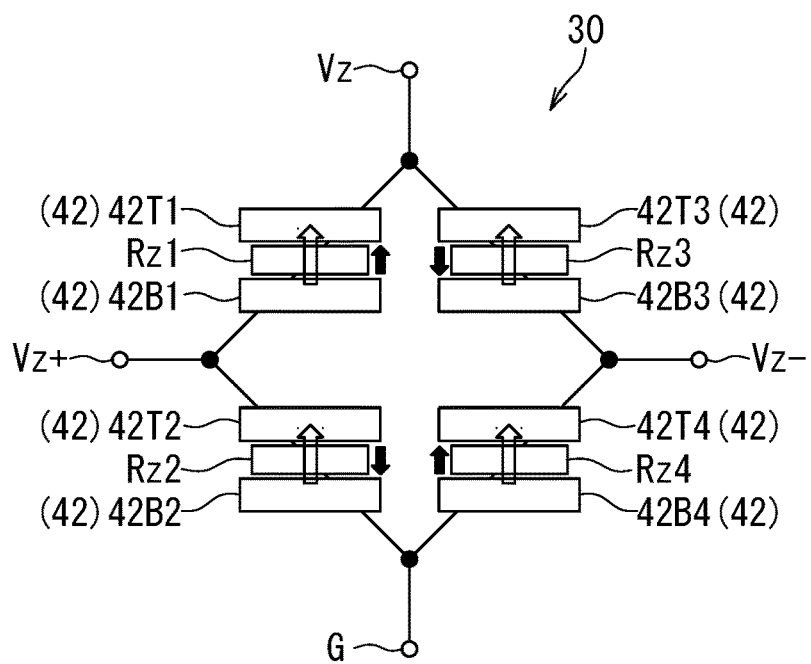
FIG. 8 is an explanatory diagram illustrating an example configuration of a magnetic-field conversion section of the embodiment of the invention.
Figure 9:
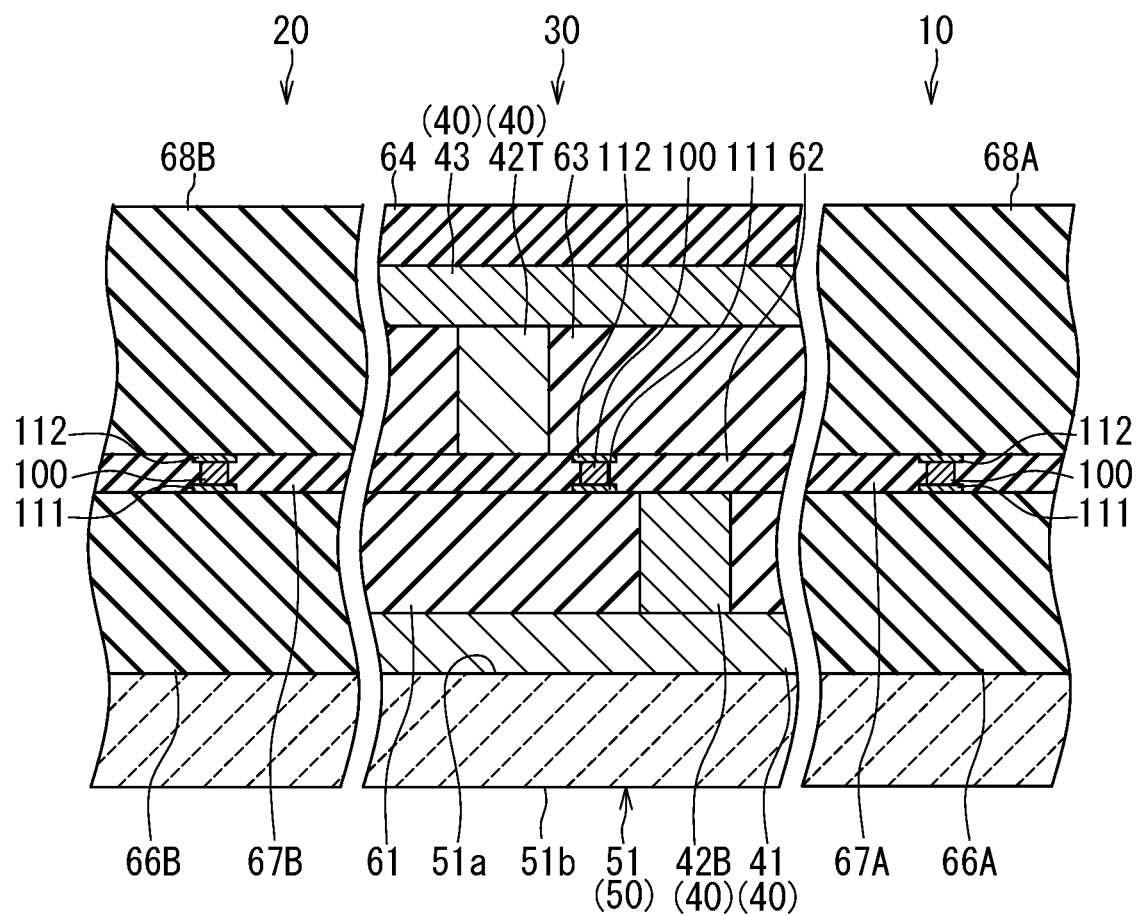
FIG. 9 is a cross-sectional view illustrating respective portions of the first to third magnetic sensors and the soft magnetic structure of the embodiment of the invention.

The magnetic sensor device 1 further includes a soft magnetic structure 40 formed of a soft magnetic material. The soft magnetic structure 40 includes a magnetic-field conversion section 42 and at least one soft magnetic layer. The magnetic-field conversion section 42 is shown in FIGS. 8 and 9 to be described later. The magnetic-field conversion section 42 is configured to receive the component in a direction parallel to the third direction of the external magnetic field and output an output magnetic field component, the output magnetic field component being in a direction perpendicular to the third direction. Hereinafter, the component in a direction parallel to the third direction of the external magnetic field will be referred to as the input magnetic field component. The output magnetic field component has a strength having a correspondence with the strength of the input magnetic field component. The third magnetic sensor 30 detects the strength of the input magnetic field component by detecting the strength of the output magnetic field component. The soft magnetic structure 40 will be described in detail later.

The magnetic sensor device 1 further includes a support 50. The support 50 is a structure for supporting the first to third magnetic sensors 10, 20 and 30 and the soft magnetic structure 40. The support 50 includes a substrate 51. The substrate 51 has a top surface 51a and a bottom surface opposite to each other.

Now, we define X, Y and Z directions as shown in FIG. 1. The X, Y and Z directions are orthogonal to one another. The X and Y directions are parallel to the top surface 51a of the substrate 51. The Z direction is perpendicular to the top surface 51a of the substrate 51 and from the bottom surface of the substrate 51 to the top surface 51a of the substrate 51. The opposite directions to the X, Y, and Z directions will be referred to as −X, −Y, and −Z directions, respectively. As used herein, the term "above" refers to positions located forward of a reference position in the Z direction, and "below" refers to positions located on a side of the reference position opposite to "above". For each component of the magnetic sensor device 1, the term "top surface" as used herein refers to a surface of the component lying at the end thereof in the Z direction, and "bottom surface" refers to a surface of the component lying at the end thereof in the −Z direction.

In this embodiment, specifically, the first direction is the same as the X direction, the second direction is the same as the Y direction, and the third direction is the same as the Z direction.

The first to third magnetic sensors 10, 20 and 30 and the soft magnetic structure 40 are disposed on or above the top surface 51a of the substrate 51. The first magnetic sensor 10 and the soft magnetic structure 40 are aligned in a direction intersecting the first direction or the X direction. The second magnetic sensor 20 and the soft magnetic structure 40 are aligned in a direction intersecting the second direction or the Y direction.

The support 50 has a reference plane RP parallel to the first and second directions (the X and Y directions). The reference plane RP is orthogonal to the third direction (the Z direction). In this embodiment, the reference plane RP is specifically the top surface 51a of the substrate 51.

The reference plane RP includes three different regions: a first region A10; a second region A20; and a third region A40. The first region A10 is a region formed by vertically projecting the first magnetic sensor 10 onto the reference plane RP. The second region A20 is a region formed by vertically projecting the second magnetic sensor 20 onto the reference plane RP. The third region A40 is a region formed by vertically projecting the soft magnetic structure 40 onto the reference plane RP. Note that a region formed by vertically projecting the third magnetic sensor 30 onto the reference plane RP coincides or substantially coincides with the third region A40.

Here, two mutually orthogonal straight lines lying in the reference plane RP and passing through the centroid C40 of the third region A40 will be referred to as a first straight line L1 and a second straight line L2. At least part of the first region A10 is located to be intersected by the first straight line L1. At least part of the second region A20 is located to be intersected by the second straight line L2. In this embodiment, specifically, the first straight line L1 is parallel to the Y direction, and the second straight line L2 is parallel to the X direction.

In this embodiment, the first magnetic sensor 10 includes a first portion 11 and a second portion 12 located at different positions from each other. The first region A10 includes a region A11 formed by vertically projecting the first portion 11 onto the reference plane RP, and a region A12 formed by vertically projecting the second portion 12 onto the reference plane RP. The regions A11 and A12 are located on two sides of the third region A40 that are opposite to each other in a direction parallel to the first straight line L1.

The second magnetic sensor 20 includes a first portion 21 and a second portion 22 located at different positions from each other. The second region A20 includes a region A21 formed by vertically projecting the first portion 21 onto the reference plane RP, and a region A22 formed by vertically projecting the second portion 22 onto the reference plane RP. The regions A21 and A22 are located on two sides of the third region A40 that are opposite to each other in a direction parallel to the second straight line L2.

When the first region A10 consists of a single region, the first region A10 is located to be intersected by the first straight line L1. Likewise, when the second region A20 consists of a single region, the second region A20 is located to be intersected by the second straight line L2.

Only part of the first region A10 being located to be intersected by the first straight line L1 means such a configuration that the first region A10 is composed of a plurality of regions separate from each other and one or more, but not all, of those plurality of regions are located to be intersected by the first straight line L1.

In this embodiment, the first region A10 is composed of the two regions A11 and A12, and both of the two regions A11 and A12 are located to be intersected by the first straight line L1.

Only part of the second region A20 being located to be intersected by the second straight line 2 means such a configuration that the second region A20 is composed of a plurality of regions separate from each other and one or more, but not all, of those plurality of regions are located to be intersected by the second straight line L2.

In this embodiment, the second region A20 is composed of the two regions A21 and A22, and both of the two regions A21 and A22 are located to be intersected by the second straight line L2.

Regardless of whether the first region A10 consists of a single region or includes a plurality of regions, it is preferred that no portion of the first region A10 be intersected by the second straight line L2. Likewise, regardless of whether the second region S20 consists of a single region or includes a plurality of regions, it is preferred that no portion of the second region A20 be intersected by the first straight line L1.

In this embodiment, in particular, the first region. A10 and the second region A20 have such a positional relationship that rotating the first region A10 by 90° about the centroid C40 of the third region A40 when viewed in the third direction (the Z direction) makes the first region A10 coincide with the second region A20. In FIG. 1, rotating the regions A11 and A12 counterclockwise by 90° about the centroid C40 makes the regions A11 and A12 coincide with the regions A21 and A22, respectively.

As shown in FIG. 1, the magnetic sensor device 1 further includes a plurality of terminals disposed on or above the top surface 51a of the substrate 51. The plurality of terminals include; a power supply terminal Vx and output terminals Vx+ and Vx− corresponding to the first magnetic sensor 10; a power supply terminal Vy and output terminals Vy+ and Vy− corresponding to the second magnetic sensor 20; a power supply terminal Vz and output terminals Vz+ and Vz− corresponding to the third magnetic sensor 30; and a ground terminal G shared between the first to third magnetic sensors 10, 20 and 30.

Figure 2:
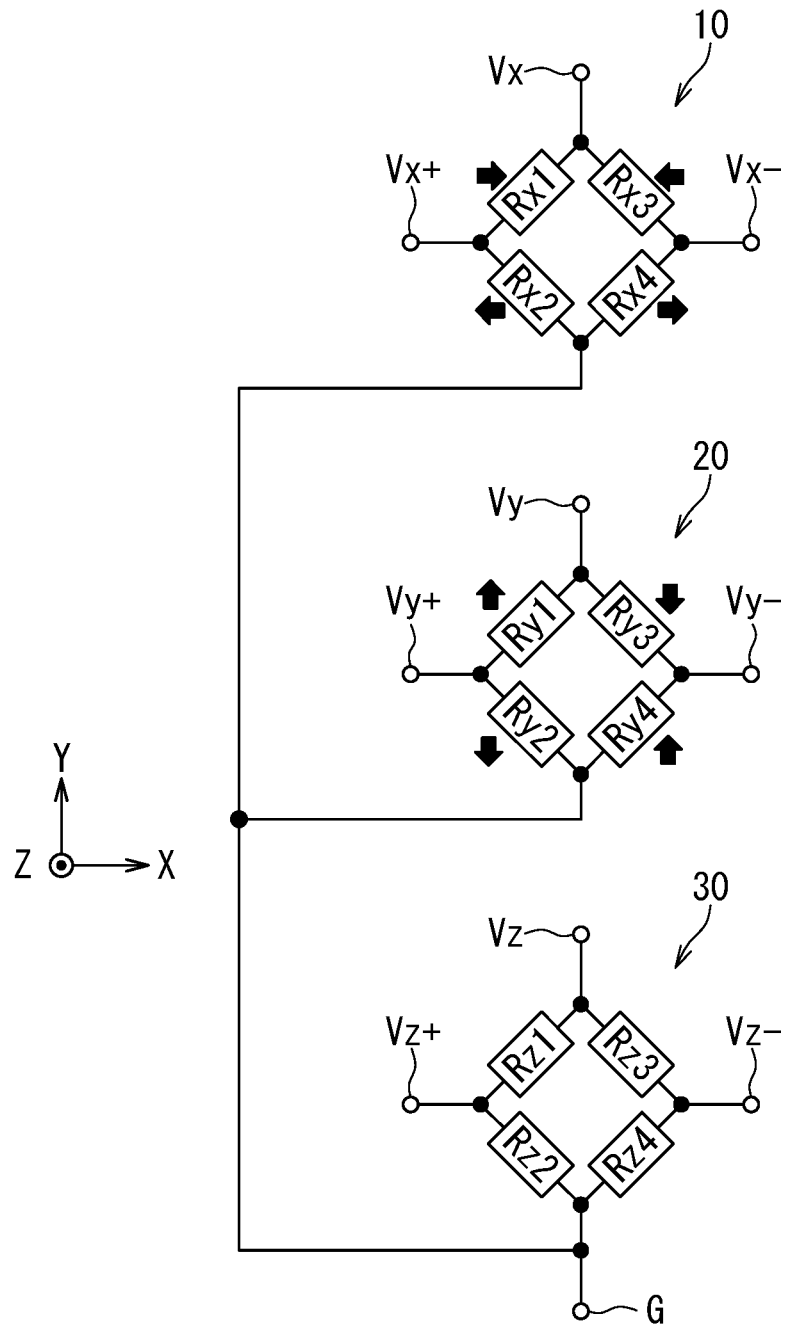
FIG. 2 is a circuit diagram illustrating an example circuit configuration of the magnetic sensor device according to the embodiment of the invention.

Reference is now made to FIG. 2 to describe an example circuit configuration of the magnetic sensor device 1. In this example, the first magnetic sensor 10 includes four resistor sections Rx1, Rx2, Rx3, and Rx4 constituting a Wheatstone bridge circuit. Each of the resistor sections Rx1, Rx2, Rx3, and Rx4 has a resistance value that varies depending on the component in a direction parallel to the first direction (the X direction) of the external magnetic field. The resistor section Rx1 is provided between the power supply terminal Vx and the output terminal Vx+. The resistor section Rx2 is provided between the output terminal Vx+ and the ground terminal G. The resistor section Rx3 is provided between the power supply terminal Vx and the output terminal Vx−. The resistor section Rx4 is provided between the output terminal Vx− and the ground terminal G.

The second magnetic sensor 20 includes four resistor sections Ry1, Ry2, Ry3, and Ry4 constituting a Wheatstone bridge circuit. Each of the resistor sections Ry1, Ry2, Ry3, and Ry4 has a resistance value that varies depending on the component in a direction parallel to the second direction (the Y direction) of the external magnetic field. The resistor section Ry1 is provided between the power supply terminal Vy and the output terminal Vy+. The resistor section Ry2 is provided between the output terminal Vy+ and the ground terminal G. The resistor section Ry3 is provided between the power supply terminal Vy and the output terminal Vy−. The resistor section Ry4 is provided between the output terminal Vy− and the ground terminal G.

The third magnetic sensor 30 includes four resistor sections Rz1, Rz2, Rz3, and Rz4 constituting a Wheatstone bridge circuit. Each of the resistor sections Rz1, Rz2, Rz3, and Rz4 has a resistance value that varies depending on the output magnetic field component outputted from the magnetic-field conversion section 42. The resistor section Rz1 is provided between the power supply terminal Vz and the output terminal Vz+. The resistor section Rz2 is provided between the output terminal Vz+ and the ground terminal G. The resistor section Rz3 is provided between the power supply terminal Vz and the output terminal Vz−. The resistor section Rz4 is provided between the output terminal Vz− and the ground terminal G.

Hereinafter, the term "resistor section R" is used to refer to any one of the resistor sections Rx1, Rx2, Rx3, Rx4, Ry1, Ry2, Ry3, Ry4, Rz1, Rz2, Rz3, and Rx4. Each of the resistor sections R includes at least one magnetic detection element. The at least one magnetic detection element includes at least one magnetic layer. In this embodiment, the at least one magnetic detection element is specifically at least one magnetoresistive element. The magnetoresistive element will hereinafter be referred to as MR element.

In this embodiment, the MR element is specifically a spin-valve MR element. The spin-valve MR element includes a magnetization pinned layer which is a magnetic layer whose magnetization direction is fixed, a free layer which is a magnetic layer whose magnetization direction is variable depending on the direction of an applied magnetic field, and a gap layer located between the magnetization pinned layer and the free layer. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The spin-valve MR element varies in resistance value depending on the angle that the magnetization direction of the free layer forms with the magnetization direction of the magnetization pinned layer. The resistance value of the spin-valve MR element is minimized when the foregoing angle is 0°, and maximized when the foregoing angle is 180°. In each MR element, the free layer has a shape anisotropy that sets the direction of the magnetization easy axis to be orthogonal to the magnetization direction of the magnetization pinned layer.

In FIG. 2, the filled arrows indicate the magnetization directions of the magnetization pinned layers of the MR elements. In the example shown in FIG. 2, the magnetization pinned layers of the MR elements in the resistor sections Rx1 and Rx4 have magnetizations in the X direction, and the magnetization pinned layers of the MR elements in the resistor sections Rx2 and Rx3 have magnetizations in the −X direction.

The magnetization pinned layers of the MR elements in the resistor sections Ry1 and Ry4 have magnetizations in the Y direction, and the magnetization pinned layers of the MR elements in the resistor sections Ry2 and Ry3 have magnetizations in the −Y direction. A description will be given later as to the magnetization directions of the magnetization pinned layers of the MR elements in the resistor sections Rz1, Rz2, Rz3 and Rz4.

The detection value for the component in a direction parallel to the first direction (the X direction) of the external magnetic field has a correspondence with a potential difference between the output terminal Vx+ and the output terminal Vx−. The detection value for the component in a direction parallel to the second direction (the Y direction) of the external magnetic field has a correspondence with a potential difference between the output terminal Vy+ and the output terminal Vy−. The detection value for the component in a direction parallel to the third direction (the Z direction) of the external magnetic field, i.e., the input magnetic field component, has a correspondence with a potential difference between the output terminal Vz+ and the output terminal Vz−. For example, each detection value may be an amplitude-adjusted or offset-adjusted value of the corresponding potential difference.

Figure 3:
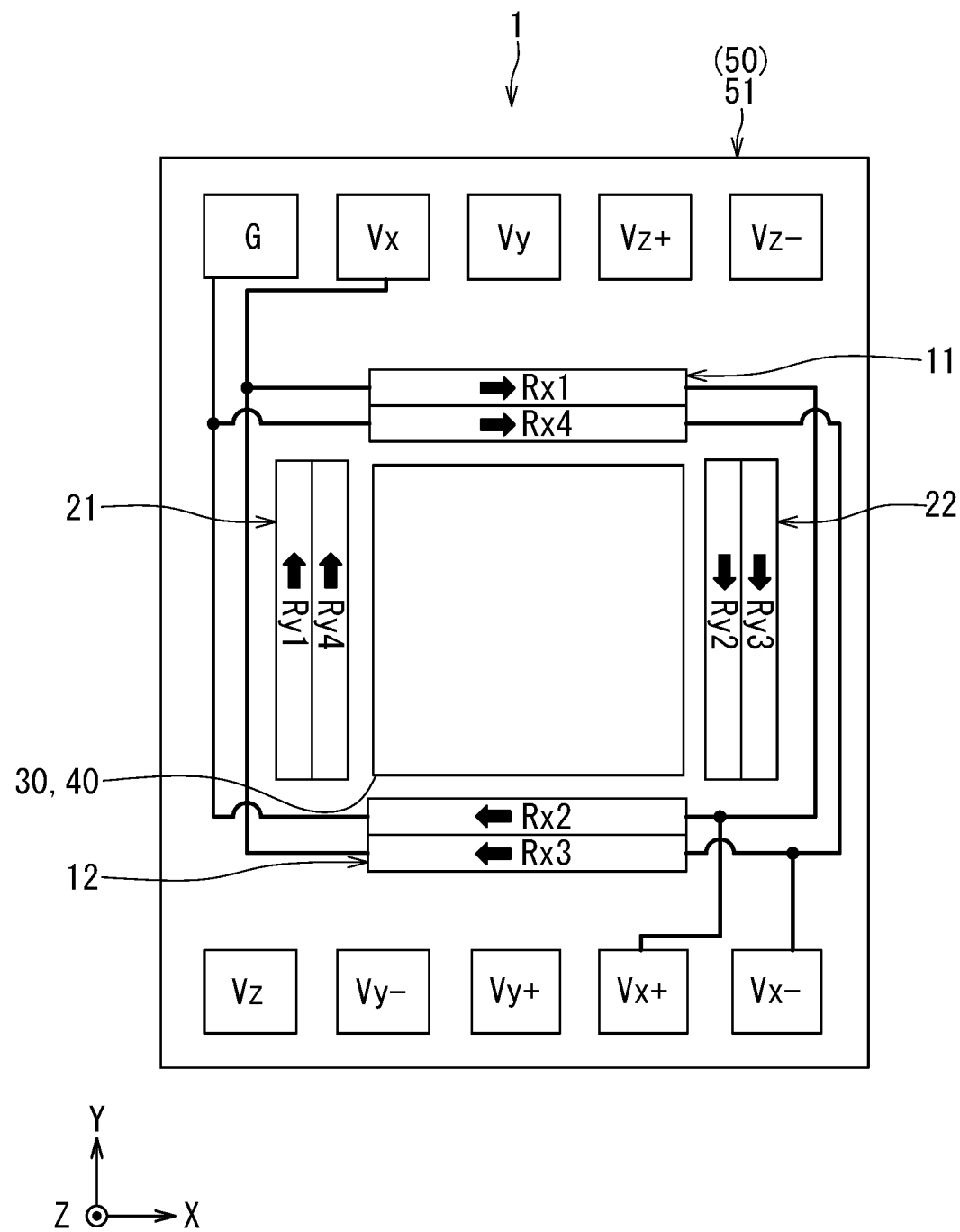
FIG. 3 is an explanatory diagram illustrating the configuration of first and second magnetic sensors and wiring for the first magnetic sensor of the embodiment of the invention.
Figure 4:
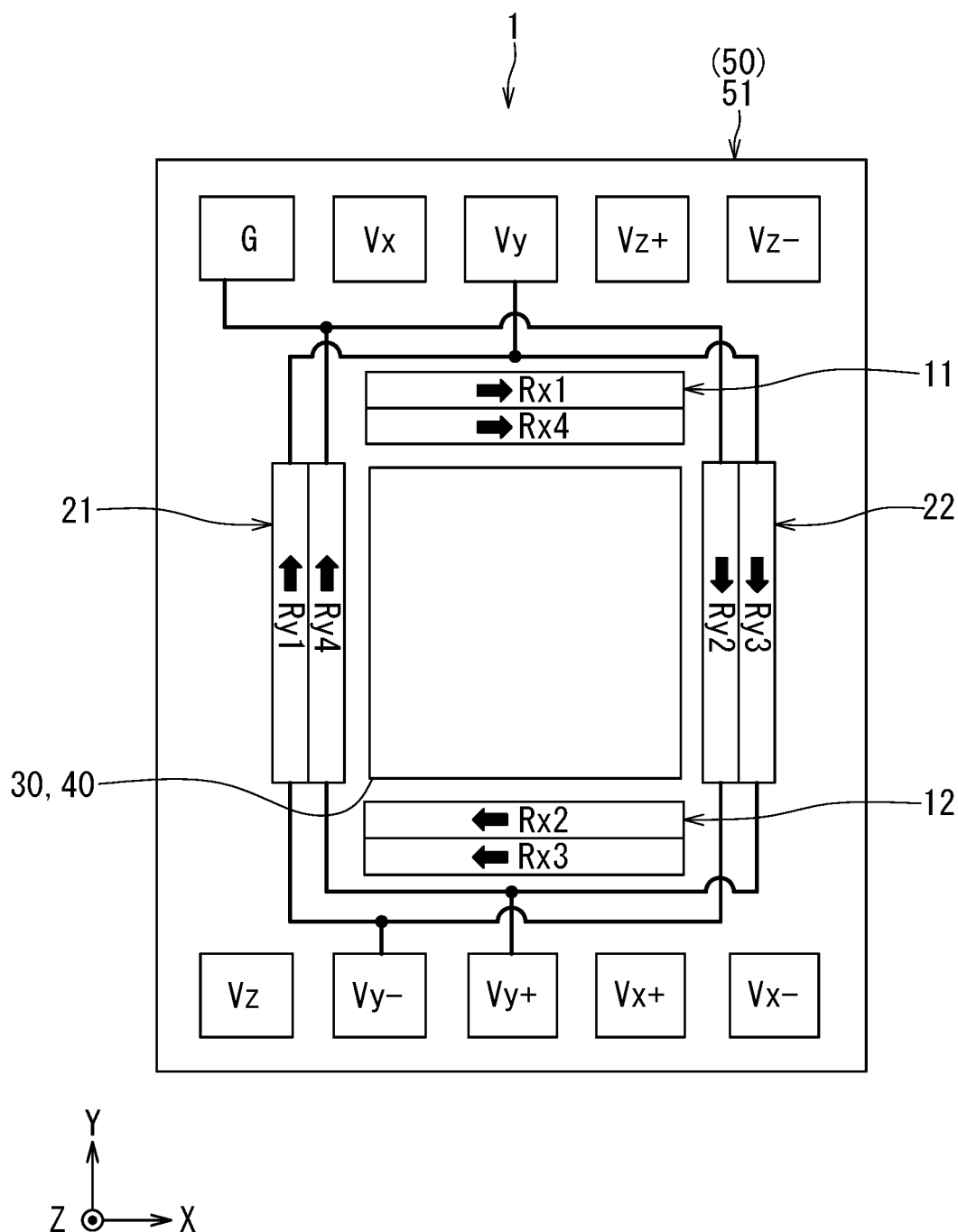
FIG. 4 is an explanatory diagram illustrating the configuration of the first and second magnetic sensors and wiring for the second magnetic sensor of the embodiment of the invention.

Now, an example of arrangement of the resistor sections Rx1, Rx2, Rx3, Rx4, Ry1, Ry2, Ry3, and Ry4 will be described with reference to FIGS. 3 and 4. In this example, the first portion 11 of the first magnetic sensor 10 includes the resistor sections Rx1 and Rx4, and the second portion 12 of the first magnetic sensor 10 includes the resistor sections Rx2 and Rx3. The first portion 21 of the second magnetic sensor 20 includes the resistor sections Ry1 and Ry4, and the second portion 22 of the second magnetic sensor 20 includes the resistor sections Ry2 and Ry3. FIG. 3 also illustrates wiring for the first magnetic sensor 10. FIG. 4 also illustrates wiring for the second magnetic sensor 20.

In FIGS. 3 and 4, the filled arrows indicate the magnetization directions of the magnetization pinned layers of the MR elements. In the example shown in FIGS. 3 and 4, the magnetization pinned layers of the MR elements in the first portion 11 of the first magnetic sensor 10, the second portion 12 of the first magnetic sensor 10, the first portion 21 of the second magnetic sensor 20, and the second portion 22 of the second magnetic sensor 20 have the same magnetization direction. According to this example, it is thus easy to set the magnetization directions of the magnetization pinned layers in a plurality of MR elements.

Figure 5:
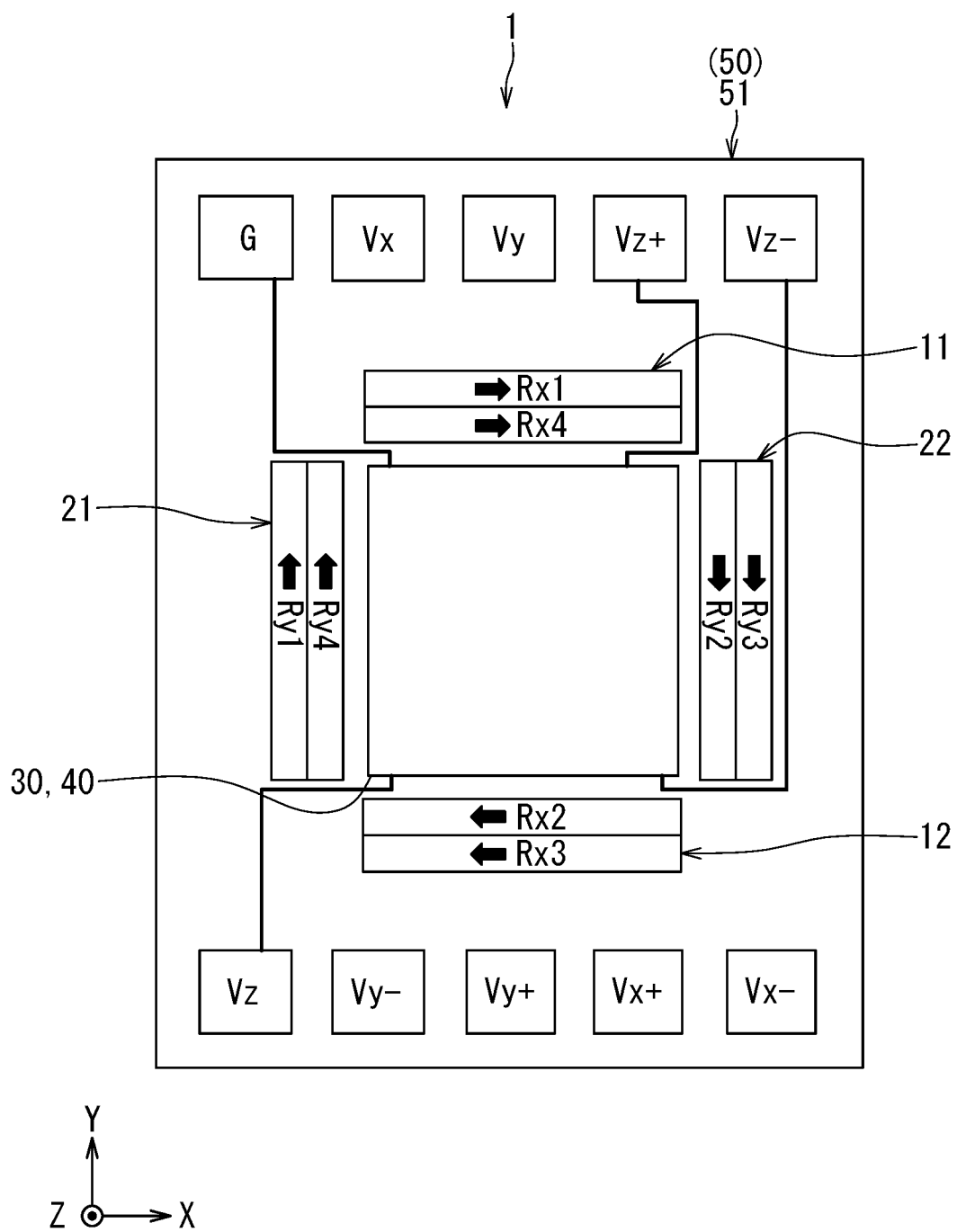
FIG. 5 is an explanatory diagram illustrating wiring for a third magnetic sensor of the embodiment of the invention.

FIG. 5 illustrates wiring for the third magnetic sensor 30.

An example configuration of the MR element will now be described with reference to FIG. 6. The MR element 100 shown in FIG. 6 includes an antiferromagnetic layer 101, a magnetization pinned layer 102, a gap layer 103, and a free layer 104, which are stacked in this order from the substrate-51 side. The antiferromagnetic layer 101 is formed of an antiferromagnetic material and is in exchange coupling with the magnetization pinned layer 102 so as to fix the magnetization direction of the magnetization pinned layer 102.

Figure 6:
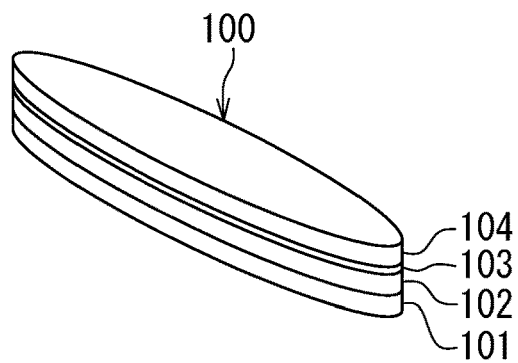
FIG. 6 is a perspective view of a magnetoresistive element of the embodiment of the invention.

It should be noted that the layers 101 to 104 of the MR element 100 may be stacked in the reverse order to that shown in FIG. 6. Alternatively, the MR element 100 may be configured without the antiferromagnetic layer 101. In such a case, for example, the antiferromagnetic layer 101 and the magnetization pinned layer 102 may be replaced with a magnetization pinned layer of an artificial antiferromagnetic structure, which includes two ferromagnetic layers and a nonmagnetic metal layer between the two ferromagnetic layers. The magnetic detection elements need not necessarily be MR elements, and may be any elements that include at least one magnetic layer and are configured to detect a magnetic field, such as magnetic impedance elements.

Figure 7:
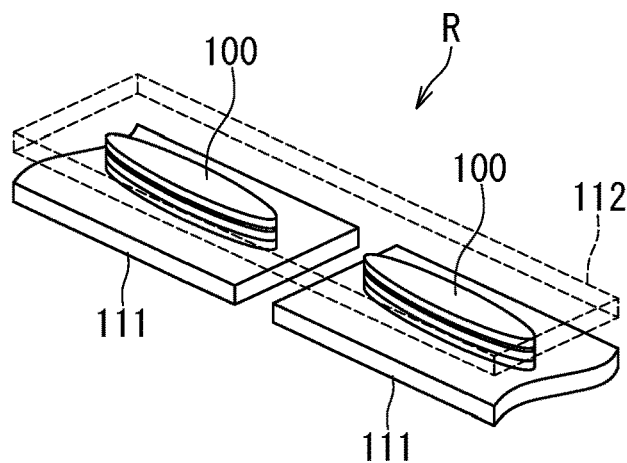
FIG. 7 is a perspective view of part of a resistor section of the embodiment of the invention.

An example configuration of the resistor section R will now be described with reference to FIG. 7. In this example, the resistor section R includes a plurality of MR elements 100 connected in series. The resistor section R further includes one or more connection layers each of which electrically connects two MR elements 100 that are adjacent to each other in circuit configuration, so that the plurality of MR elements 100 are connected in series. In the example shown in FIG. 7, the resistor section R includes one or more upper connection layers 112 and one or more lower connection layers 111, as the one or more connection layers. Each lower connection layer 111 is in contact with the bottom surfaces of two MR elements 100 that are adjacent to each other in circuit configuration, and electrically connects the two MR elements 100. Each upper connection layer 112 is in contact with the top surfaces of two MR elements 100 that are adjacent to each other in circuit configuration, and electrically connects the two MR elements 100.

Next, an example configuration of the magnetic-field conversion section 42 of the soft magnetic structure 40 will be described with reference to FIG. 8. In this example, the magnetic-field conversion section 42 includes: an upper yoke 42T1 and a lower yoke 42B1 corresponding to the resistor section Rz1; an upper yoke 42T2 and a lower yoke 42B2 corresponding to the resistor section Rz2; an upper yoke 42T3 and a lower yoke 42B3 corresponding to the resistor section Rz3; and an upper yoke 42T4 and a lower yoke 42B4 corresponding to the resistor section Rz4.

The upper yokes 42T1, 42T2, 42T3 and 42T4 and the lower yokes 42B1, 42B2, 42B3 and 42B4 are each in the shape of a rectangular solid that is long in a direction perpendicular to the Z direction.

The upper yoke 42T1 and the lower yoke 42B1 are located near the resistor section Rz1. The lower yoke 42B1 is located closer to the top surface 51a of the substrate 51 than is the resistor section Rz1. The upper yoke 42T1 is located farther from the top surface 51a of the substrate 51 than is the resistor section Rz1. When viewed from above, the resistor section Rz1 lies between the upper yoke 42T1 and the lower yoke 42B1.

The upper yoke 42T2 and the lower yoke 42B2 are located near the resistor section Rz2. The lower yoke 42B2 is located closer to the top surface 51a of the substrate 51 than is the resistor section. Rz2. The upper yoke 42T2 is located farther from the top surface 51a of the substrate 51 than is the resistor section Rz2. When viewed from above, the resistor section Rz2 lies between the upper yoke 42T2 and the lower yoke 42B2.

The upper yoke 42T3 and the lower yoke 42B3 are located near the resistor section Rz3. The lower yoke 42B3 is located closer to the top surface 51a of the substrate 51 than is the resistor section Rz3. The upper yoke 42T3 is located farther from the top surface 51a of the substrate 51 than is the resistor section Rz3. When viewed from above, the resistor section Rz3 lies between the upper yoke 42T3 and the lower yoke 42B3.

The upper yoke 42T4 and the lower yoke 42B4 are located near the resistor section Rz4. The lower yoke 42B4 is located closer to the top surface 51a of the substrate 51 than is the resistor section Rz4. The upper yoke 42T4 is located farther from the top surface 51a of the substrate 51 than is the resistor section Rz4. When viewed from above, the resistor section Rz4 lies between the upper yoke 42T4 and the lower yoke 42B4.

The output magnetic field component outputted by the magnetic-field conversion section 42 includes: a magnetic field component generated by the upper yoke 42T1 and the lower yoke 42B1 for application to the resistor section Rz1; a magnetic field component generated by the upper yoke 42T2 and the lower yoke 42B2 for application to the resistor section Rz2; a magnetic field component generated by the upper yoke 42T3 and the lower yoke 42B3 for application to the resistor section Rz3; and a magnetic field component generated by the upper yoke 42T4 and the lower yoke 42B4 for application to the resistor section Rz4.

In FIG. 8, the four hollow arrows indicate the directions of the magnetic field components applied respectively to the resistor sections Rz1, Rz2, Rz3 and Rz4 when the input magnetic field component is in the Z direction. In FIG. 8, the four filled arrows indicate the magnetization directions of the magnetization pinned layers 102 of the MR elements 100 in the resistor sections Rz1, Rz2, Rz3 and Rz4, respectively. The magnetization directions of the magnetization pinned layers 102 of the MR elements 100 in the resistor sections Rz1 and Rz4 are the same as the directions of the magnetic field components applied to the resistor sections Rz1 and Rz4, respectively, when the input magnetic field component is in the Z direction. The magnetization directions of the magnetization pinned layers 102 of the MR elements 100 in the resistor sections Rz2 and Rz3 are opposite to the directions of the magnetic field components applied to the resistor sections Rz2 and Rz3, respectively, when the input magnetic field component is in the Z direction.

The operation of the third magnetic sensor 30 will now be described. In each MR element 100 in the resistor sections Rz1, Rz2, Rz3 and Rz4, the magnetization direction of the free layer 104 when there is no input magnetic field component is perpendicular to the magnetization direction of the magnetization pinned layer 102.

When the input magnetic field component is in the Z direction, the magnetization direction of the free layer 104 in each MR element 100 in the resistor sections Rz1 and Rz4 is inclined from the direction perpendicular to the magnetization direction of the magnetization pinned layer 102 toward the magnetization direction of the magnetization pinned layer 102. On the other hand, in each MR element 100 in the resistor sections Rz2 and Rz3, the magnetization direction of the free layer 104 is inclined from the direction perpendicular to the magnetization direction of the magnetization pinned layer 102 toward the direction opposite to the magnetization direction of the magnetization pinned layer 102. As a result, the resistance values of the resistor sections Rz1 and Rz4 decrease while the resistance values of the resistor sections Rz2 and Rz3 increase, as compared with the state where there is no input magnetic field component.

When the input magnetic field component is in the −Z direction, conversely to the above situation, the resistance values of the resistor sections Rz1 and Rz4 increase while the resistance values of the resistor sections Rz2 and Rz3 decrease, as compared with the state where there is no input magnetic field component.

The amount of change in the resistance value of each of the resistor sections Rz1, Rz2, Rz3 and Rz4 depends on the strength of the input magnetic field component.

Changes in the direction and strength of the input magnetic field component cause the resistance values of the first to fourth resistor sections Rz1, Rz2, Rz3 and Rz4 to change such that the resistance values of the resistor sections Rz1 and Rz4 increase while the resistance values of the resistor sections Rz2 and Rz3 decrease, or such that the resistance values of the resistor sections Rz1 and Rz4 decrease while the resistance values of the resistor sections Rz2 and Rz3 increase. This causes a change in the potential difference between the output terminal Vz+ and the output terminal Vz−. The input magnetic field component can thus be detected based on the potential difference.

Reference is now made to FIG. 9 to describe an example of configurations of the first to third magnetic sensors 10, 20 and 30 and the soft magnetic structure 40. FIG. 9 illustrates respective portions of the first to third magnetic sensors 10, 20 and 30 and the soft magnetic structure 40. In this example, the first to third magnetic sensors 10, 20 and 30 and the soft magnetic structure 40 are disposed on the substrate 51. The substrate 51 has the top surface 51a and the bottom surface 51b.

The first magnetic sensor 10 includes insulating layers 66A, 67A and 68A each formed of an insulating material, in addition to the resistor sections Rx1, Rx2, Rx3 and Rx4. The insulating layer 66A lies on the top surface 51a of the substrate 51. The resistor sections Rx1, Rx2, Rx3 and Rx4 are disposed on the insulating layer 66A. FIG. 9 illustrates one of the MR elements 100 included in the resistor sections Rx1, Rx2, Rx3 and Rx4, and the upper and lower connection layers 112 and 111 connected to the MR element 100. The insulating layer 67A lies on the top surface 51a of the substrate 51 and surrounds the resistor sections Rx1, Rx2, Rx3 and Rx4. The insulating layer 68A covers the resistor sections Rx1, Rx2, Rx3 and Rx4 and the insulating layer 67A.

The second magnetic sensor 20 has a configuration similar to that of the first magnetic sensor 10. To be more specific, the second magnetic sensor 20 includes insulating layers 66B, 67B and 68B each formed of an insulating material, in addition to the resistor sections Ry1, Ry2, Ry3 and Ry4. The insulating layer 66B lies on the top surface 51a of the substrate 51. The resistor sections Ry1, Ry2, Ry3 and Ry4 are disposed on the insulating layer 66B. FIG. 9 illustrates one of the MR elements 100 included in the resistor sections Ry1, Ry2, Ry3 and Ry4, and the upper and lower connection layers 112 and 111 connected to the MR element 100. The insulating layer 67B lies on the top surface 51a of the substrate 51 and surrounds the resistor sections Ry1, Ry2, Ry3 and Ry4. The insulating layer 68B covers the resistor sections Ry1, Ry2, Ry3 and Ry4 and the insulating layer 67B.

The third magnetic sensor 30 includes insulating layers 61, 62, 63 and 64 each formed of an insulating material, in addition to the resistor sections Rz1, Rz2, Rz3 and Rz4. In the example shown in FIG. 9, the soft magnetic structure 40 includes the magnetic-field conversion section 42 and two soft magnetic layers 41 and 43.

The magnetic-field conversion section 42 includes the upper yokes 42T1, 42T2, 42T3 and 42T4 and the lower yokes 42B1, 42B2, 42B3 and 42B4, all of which are shown in FIG. 8. In FIG. 9, the reference sign 42B represents one of the lower yokes 42B1, 42B2, 42B3 and 42B4, and the reference sign 42T represents a corresponding one of the upper yokes 42T1, 42T2, 42T3 and 42T4.

The soft magnetic layer 41 lies on the top surface 51a of the substrate 51. The lower yokes 42B1, 42B2, 42B3 and 42B4 are disposed on the soft magnetic layer 41. The insulating layer 61 lies on the soft magnetic layer 41 and surrounds the lower yokes 42B1, 42B2, 42B3 and 42B4.

The resistor sections Rz1, Rz2, Rz3 and Rz4 are disposed on the insulating layer 61. FIG. 9 illustrates one of the MR elements 100 included in the resistor sections Rz1, Rz2, Rz3 and Rz4, and the upper and lower connection layers 112 and 111 connected to the MR element 100. The insulating layer 62 lies on the lower yokes 42B1, 42B2, 42B3 and 42B4 and the insulating layer 61, and surrounds the resistor sections Rz1, Rz3 and Rz4.

The upper yokes 42T1, 42T2, 42T3 and 42T4 are disposed on the insulating layer 62. The insulating layer 63 lies on the resistor sections Rz1, Rz2, Rz3 and Rz4 and the insulating layer 62, and surrounds the upper yokes 42T1, 42T2, 42T3 and 42T4.

The soft magnetic layer 43 lies on the upper yokes 42T1, 42T2, 42T3 and 42T4 and the insulating layer 63. The insulating layer 64 covers the soft magnetic layer 43.

As viewed from above, the soft magnetic layers 41 and 43 lie over the entire region or substantially the entire region of the third magnetic sensor 30. Both of a region formed by vertically projecting the soft magnetic layer 41 onto the top surface 51a of the substrate 51, i.e., the reference plane RP, and a region formed by vertically projecting the soft magnetic layer 43 onto the reference plane RP coincide with the third region A40. A region formed by vertically projecting the third magnetic sensor 30 onto the reference plane RP coincides or substantially coincides with the third region A40.

In the example shown in FIG. 9, all the magnetic detection elements or MR elements 100 included in the first to third magnetic sensors 10, 20 and 30 are located at equal distances from the top surface 51a of the substrate 51, i.e., the reference plane RP.

The magnetic-field conversion section 42 may include only either the upper yokes 42T1, 42T2, 42T3 and 42T4 or the lower yokes 42B1, 42B2, 42B3 and 42B4. The soft magnetic structure 40 may include only either one of the soft magnetic layers 41 and 43.

The operation and effect of the magnetic sensor device 1 according to the embodiment will now be described. In the magnetic sensor device 1 according to the embodiment, the first magnetic sensor 10 generates a detection value corresponding to the component in a direction parallel to the first direction (the X direction) of the external magnetic field. The second magnetic sensor 20 generates a detection value corresponding to the component in a direction parallel to the second direction (the Y direction) of the external magnetic field. Hereinafter, a direction parallel to the first direction (the X direction) will also be referred to as the magnetosensitive direction of the first magnetic sensor 10, and a direction parallel to the second direction (the Y direction) will also be referred to as the magnetosensitive direction of the second magnetic sensor 20. In this embodiment, the first straight line L1 is perpendicular to the magnetosensitive direction of the first magnetic sensor 10, and the second straight line L2 is perpendicular to the magnetosensitive direction of the second magnetic sensor 20.

The first magnetic sensor 10 has a magnetic hysteresis property resulting from the magnetic layers included in the magnetic detection elements. In this embodiment, the first magnetic sensor 10 includes the first portion 11 and the second portion 12, and each of the first and second portions 11 and 12 has a magnetic hysteresis property. The first magnetic sensor 10 is to detect the component in a direction parallel to the X direction of the external magnetic field. Thus, for the first and second portions 11 and 12 of the first magnetic sensor 10, a magnetic hysteresis property related to a magnetic field in a direction parallel to the X direction is of a particular concern. If each of the first and second portions 11 and 12 has a magnetic hysteresis property related to the magnetic field in a direction parallel to the X direction, the electric potential at each of the output terminals Vx+ and Vx− exhibits a hysteresis property, and as result, the detection value generated by the first magnetic sensor 10 also exhibits a hysteresis property.

Likewise, the second magnetic sensor 20 has a magnetic hysteresis property resulting from the magnetic layers included in the magnetic detection elements. In this embodiment, the second magnetic sensor 20 includes the first portion 21 and the second portion 22 and each of the first and second portions 21 and 22 has a magnetic hysteresis property. The second magnetic sensor 20 is to detect the component in a direction parallel to the Y direction of the external magnetic field. Thus, for the first and second portions 21 and 22 of the second magnetic sensor 20, a magnetic hysteresis property related to a magnetic field in a direction parallel to the Y direction is of a particular concern. If each of the first and second portions 21 and 22 has a magnetic hysteresis property related to the magnetic field in a direction parallel to the Y direction, the electric potential at each of the output terminals Vy+ and Vy− exhibits a hysteresis property, and as result, the detection value generated by the second magnetic sensor 20 also exhibits a hysteresis property.

In this embodiment, the magnetic sensor device 1 is provided with the soft magnetic structure 40. The soft magnetic structure 40 includes the magnetic-field conversion section 42 and the two soft magnetic layers 41 and 43. The soft magnetic structure 40 has a magnetic hysteresis property. In other words, the soft magnetic structure 40 has such a magnetic property that a hysteresis loop of its magnetization with varying external magnetic field indicates a residual magnetization.

Figure 10:
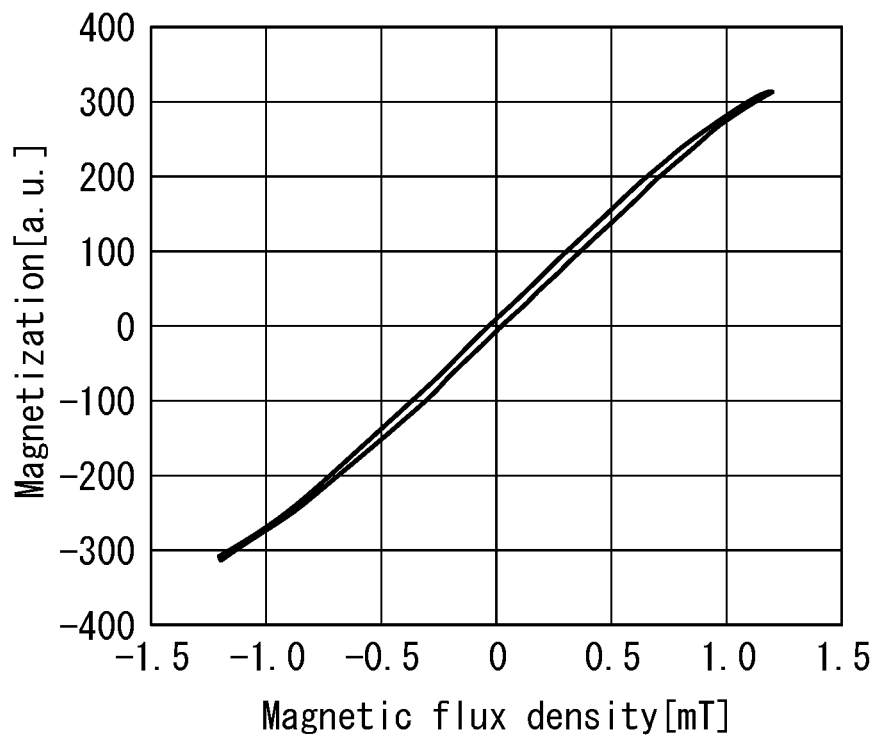
FIG. 10 is a characteristic diagram showing a hysteresis loop of the soft magnetic structure of the embodiment of the invention.
Figure 11:
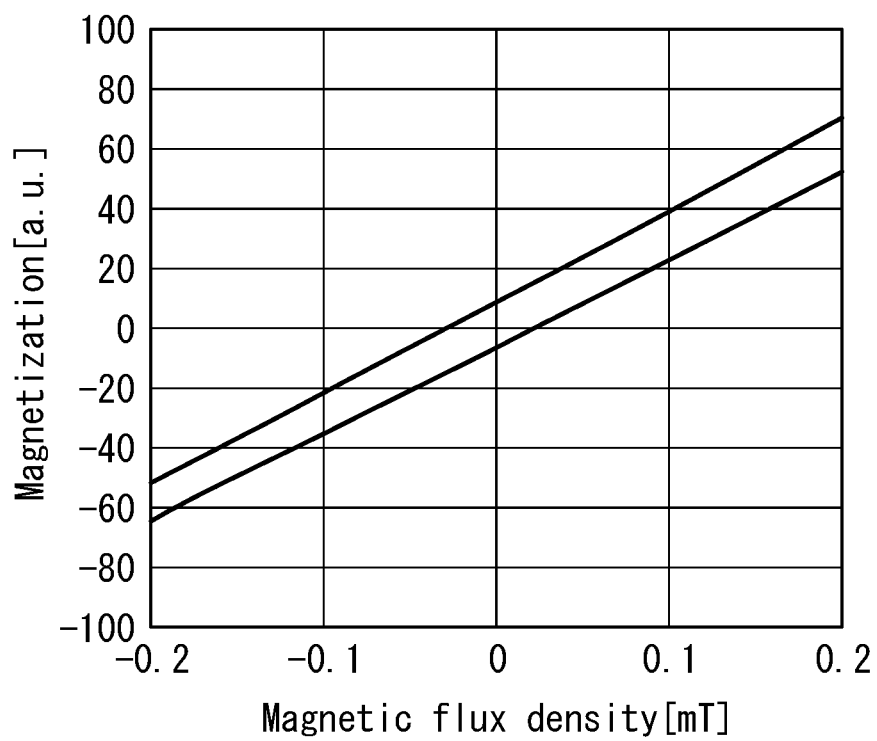
FIG. 11 is a characteristic diagram showing a portion of the hysteresis loop of FIG. 10 on an enlarged scale.

FIG. 10 is a characteristic diagram showing a hysteresis loop of the soft magnetic structure 40. FIG. 11 is a characteristic diagram showing a portion of the hysteresis loop of FIG. 10 on an enlarged scale. The hysteresis loop of FIGS. 10 and 11 was obtained by applying an external magnetic field in a direction parallel to the X or Y direction to the soft magnetic structure 40 while varying the external magnetic field within a predetermined range. In FIGS. 10 and 11, the horizontal axis represents magnetic flux density corresponding to the external magnetic field, which is determinable from the external magnetic field. Positive values on the horizontal axis represent magnetic flux densities each corresponding to the external magnetic field in the X or Y direction, and negative values on the horizontal axis represent magnetic flux densities each corresponding to the external magnetic field in the −X or −Y direction. The vertical axis represents the magnetization of the soft magnetic structure 40. The horizontal axis is in mT, and the vertical axis is in arbitrary units (a.u.). As shown in FIGS. 10 and 11, the soft magnetic structure 40 has such a magnetic property that the hysteresis loop of its magnetization with varying external magnetic field indicates a residual magnetization.

In this embodiment, the first magnetic sensor 10 and the soft magnetic structure 40 are configured so that in the presence of a residual magnetization in the soft magnetic structure 40, a magnetic field based on the residual magnetization of the soft magnetic structure 40 is applied to the first magnetic sensor 10.

Figure 12:
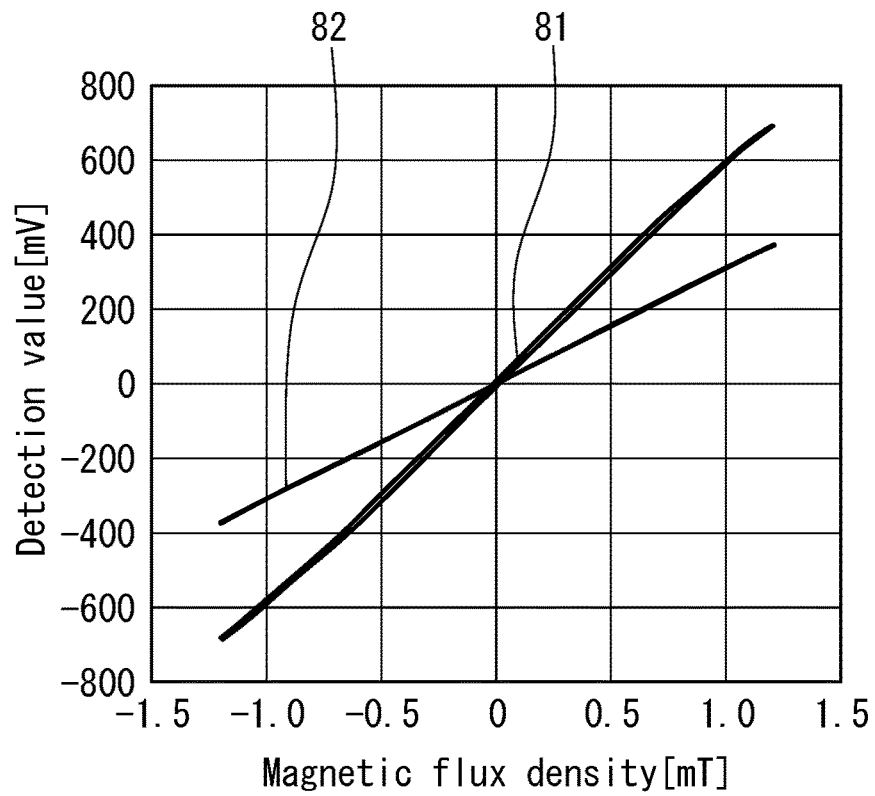
FIG. 12 is a characteristic diagram showing hysteresis loops of detection values generated by a first-type magnetic sensor of the embodiment of the invention.
Figure 13:
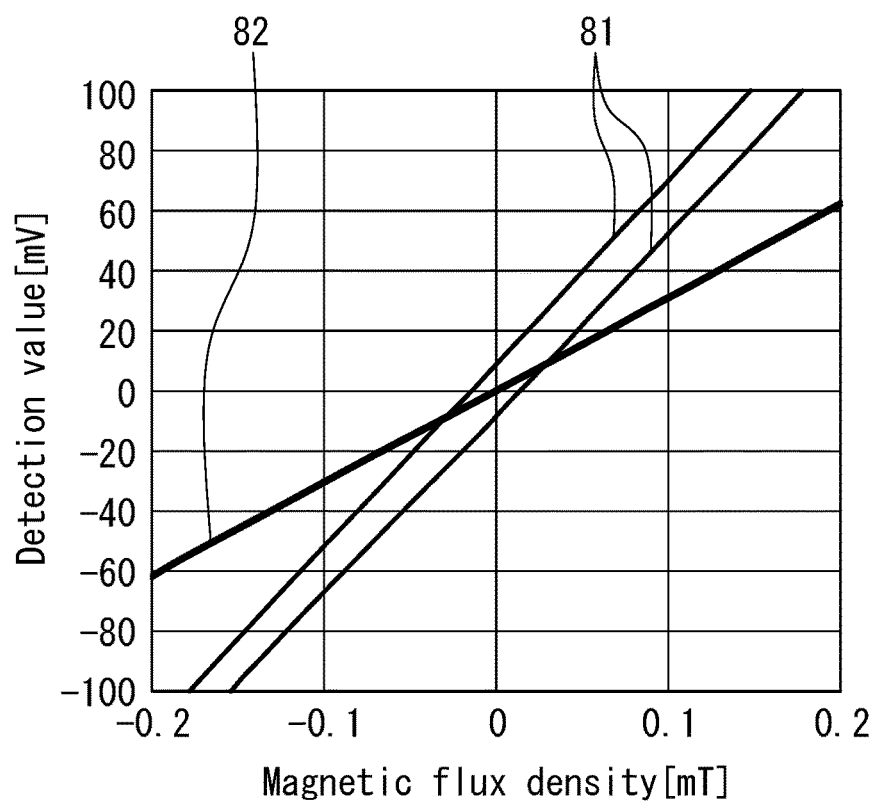
FIG. 13 is a characteristic diagram showing portions of the hysteresis loops of FIG. 12 on an enlarged scale.

FIG. 12 is a characteristic diagram showing hysteresis loops of detection values generated by the first magnetic sensor 10. FIG. 13 is a characteristic diagram showing portions of the hysteresis loops of FIG. 12 on an enlarged scale. The hysteresis loops of FIGS. 12 and 13 were obtained by applying an external magnetic field in a direction parallel to the X direction to the first magnetic sensor 10 while varying the external magnetic field within a predetermined range. In FIGS. 12 and 13, the horizontal axis represents magnetic flux density corresponding to the external magnetic field, and the vertical axis represents the detection value of the first magnetic sensor 10. Positive values on the horizontal axis represent magnetic flux densities each corresponding to the external magnetic field in the X direction, and negative values on the horizontal axis represent magnetic flux densities each corresponding to the external magnetic field in the −X direction. The horizontal axis is in mT, and the vertical axis is in mV. The reference numeral 81 represents the hysteresis loop of the detection value of the first magnetic sensor 10 when used by itself, that is, when used in isolation from the magnetic sensor device 1. The reference numeral 82 represents the hysteresis loop of the detection value of the first magnetic sensor 10 when used in the magnetic sensor device 1.

When the external magnetic field is zero, ideally, the first magnetic sensor 10 should generate a detection value of zero. However, as described above, the first magnetic sensor 10 has a magnetic hysteresis property. Accordingly, as indicated by the reference numeral 81 in FIG. 13, the first magnetic sensor 10 when used by itself exhibits such a property that in the hysteresis loop of the detection value with varying external magnetic field, the detection value when the external magnetic field is zero is different from the ideal value by a first value other than zero.

In this embodiment, as indicated by the reference numeral 82 in FIG. 13, the first magnetic sensor 10 when used in the magnetic sensor device 1 exhibits such a property that in the hysteresis loop of the detection value with varying external magnetic field, the detection value when the external magnetic field is zero is different from the ideal value by a second value. The second value is smaller in absolute value than the first value. This is because the first magnetic sensor 10 and the soft magnetic structure 40 are configured so that in the presence of a residual magnetization in the soft magnetic structure 40, a magnetic field based on the residual magnetization of the soft magnetic structure 40 is applied to the first magnetic sensor 10. The second value may be zero.

The second magnetic sensor 20 and the soft magnetic structure 40 are configured so that in the presence of a residual magnetization in the soft magnetic structure 40, a magnetic field based on the residual magnetization of the soft magnetic structure 40 is applied to the second magnetic sensor 20, as is the case with the first magnetic sensor 10 and the soft magnetic structure 40.

When an external magnetic field in a direction parallel to the Y direction is applied to the second magnetic sensor 20, the detection values generated by the second magnetic sensor 20 exhibit similar hysteresis loops to those of the detection values of the first magnetic sensor 10 shown in FIGS. 12 and 13. To be more specific, the second magnetic sensor 20 when used by itself exhibits such a property that in the hysteresis loop of the detection value with varying external magnetic field, the detection value when the external magnetic field is zero is different from the ideal value by a first value other than zero. The second magnetic sensor 20 when used in the magnetic sensor device 1 exhibits such a property that in the hysteresis loop of the detection value with varying external magnetic field, the detection value when the external magnetic field is zero is different from the ideal value by a second value. The second value is smaller in absolute value than the first value. This is because the second magnetic sensor 20 and the soft magnetic structure 40 are configured so that in the presence of a residual magnetization in the soft magnetic structure 40, a magnetic field based on the residual magnetization of the soft magnetic structure 40 is applied to the second magnetic sensor 20. The second value may be zero.

Figure 14:
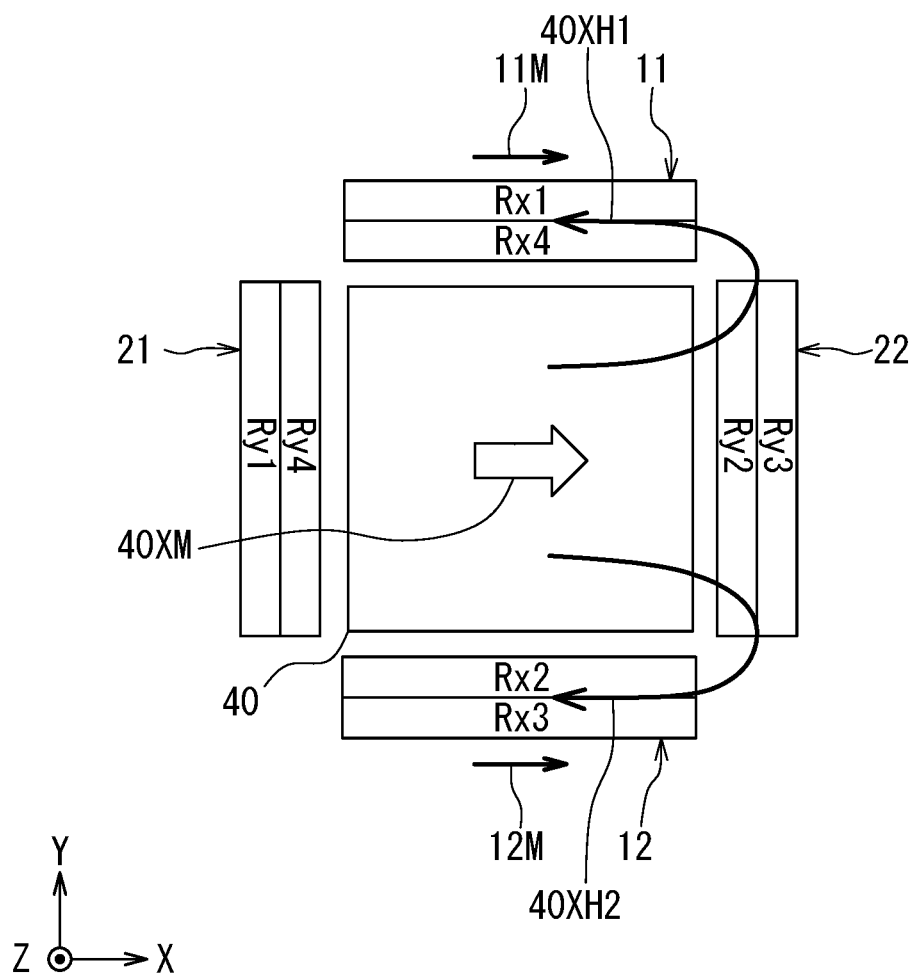
FIG. 14 is an explanatory diagram for explaining the effect of the magnetic sensor device according to the embodiment of the invention.

The effect of the magnetic sensor device 1 according to the embodiment will be described in more detail with reference to FIGS. 14 and 15. FIG. 14 illustrates a state in which an external magnetic field in the X direction has become zero after application to the magnetic sensor device 1. When in this state, the first and second portions 11 and 12 of the first magnetic sensor 10 respectively have magnetizations 11M and 12M, both of which are in the X direction. The soft magnetic structure 40 has a magnetization 40XM, which is also in the X direction.

The soft magnetic structure 40 generates a magnetic field due to the magnetization 40XM. A partial magnetic field 40XH1, which is a part of the magnetic field resulting from the magnetization 40XM, is applied to the first portion 11. A partial magnetic field 40XH2, which is another part of the magnetic field resulting from the magnetization 40XM, is applied to the second portion 12. The partial magnetic field 40XH1 contains a component in the direction opposite to the direction of the magnetization 11M, that is, a component in the –X direction. The partial magnetic field 40XH2 contains a component in the direction opposite to the direction of the magnetization 12M, that is, a component in the –X direction. In the first portion 11, a magnetic field resulting from the magnetization 11M and the partial magnetic field 40XH1 cancel each other out, so that a magnetic field acting on the first portion 11 becomes smaller in absolute value when compared with the case without the partial magnetic field 40XH1. Likewise, in the second portion 12, a magnetic field resulting from the magnetization 12M and the partial magnetic field 40XH2 cancel each other out, so that a magnetic field acting on the second portion 12 becomes smaller in absolute value when compared with the case without the partial magnetic field 40XH2.

When an external magnetic field in the –X direction has become zero after application to the magnetic sensor device 1, the directions of the magnetizations of the first and second portions 11 and 12 of the first magnetic sensor 10 and the magnetization of the soft magnetic structure 40 become opposite to those in the above-described situation. In this case also, as described above, a magnetic field acting on the first portion 11 becomes smaller in absolute value when compared with the case without the partial magnetic field 40XH1, and a magnetic field acting on the second portion 12 becomes smaller in absolute value when compared with the case without the partial magnetic field 40XH2.

For the above reasons, according to this embodiment, the detection value generated by the first magnetic sensor 10 when the external magnetic field is zero has a smaller difference from the ideal value than in the case without the partial magnetic fields 40XH1 and 40XH2.

Figure 15:
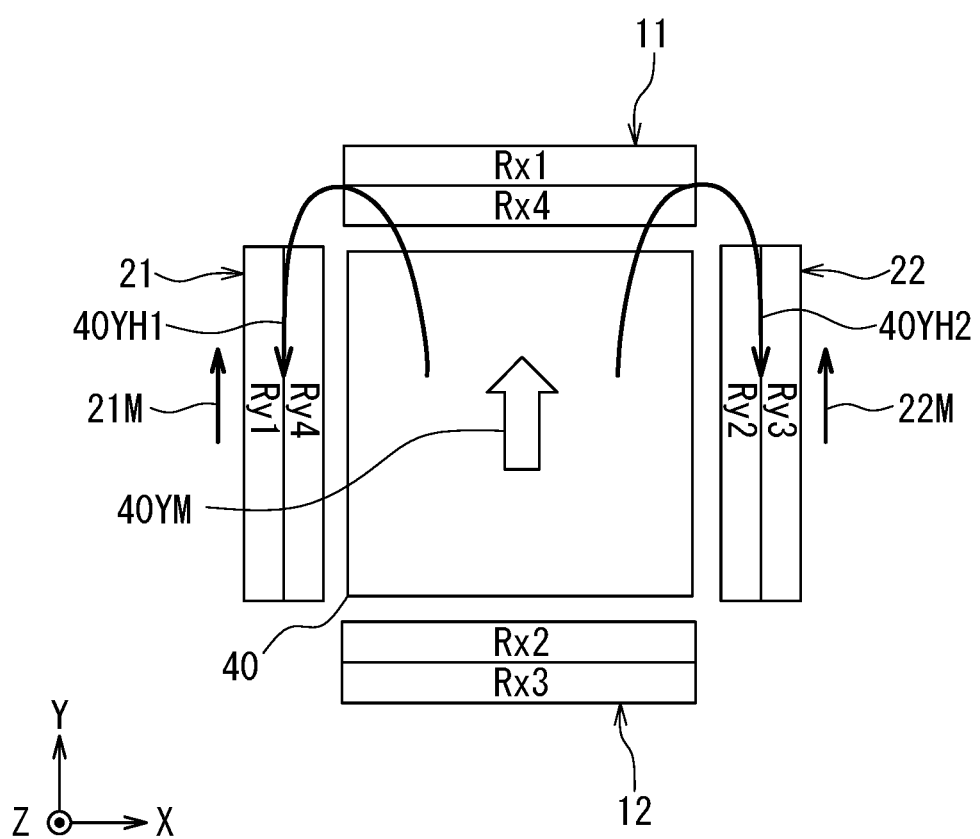
FIG. 15 is an explanatory diagram for explaining the effect of the magnetic sensor device according to the embodiment of the invention.

FIG. 15 illustrates a state in which an external magnetic field in the Y direction has become zero after application to the magnetic sensor device 1. When in this state, the first and second portions 21 and 22 of the second magnetic sensor 20 respectively have magnetizations 21M and 22M, both of which are in the Y direction. The soft magnetic structure 40 has a magnetization 40YM, which is also in the Y direction.

The soft magnetic structure 40 generates a magnetic field due to the magnetization 40YM. A partial magnetic field 40YH1, which is a part of the magnetic field resulting from the magnetization 40YM, is applied to the first portion 21. A partial magnetic field 40YH2, which is another part of the magnetic field resulting from the magnetization 40YM, is applied to the second portion 22. The partial magnetic field 40YH1 contains a component in the direction opposite to the direction of the magnetization 21M, that is, a component in the –Y direction. The partial magnetic field 40YH2 contains a component in the direction opposite to the direction of the magnetization 22M, that is, a component in the –Y direction. In the first portion 21, a magnetic field resulting from the magnetization 21M and the partial magnetic field 40YH1 cancel each other out, so that a magnetic field acting on the first portion 21 becomes smaller in absolute value when compared with the case without the partial magnetic field 40YH1. Likewise, in the second portion 22, a magnetic field resulting from the magnetization 22M and the partial magnetic field 40YH2 cancel each other out so that a magnetic field acting on the second portion 22 becomes smaller in absolute value when compared with the case without the partial magnetic field 40YH2.

When an external magnetic field in the –Y direction has become zero after application to the magnetic sensor device 1, the directions of the magnetizations of the first and second portions 21 and 22 of the second magnetic sensor 20 and the magnetization of the soft magnetic structure 40 become opposite to those in the above-described situation. In this case also, as described above, a magnetic field acting on the first portion 21 becomes smaller in absolute value when compared with the case without the partial magnetic field 40YH1, and a magnetic field acting on the second portion 22 becomes smaller in absolute value when compared with the case without the partial magnetic field 40YH2.

For the above reasons, according to this embodiment, the detection value generated by the second magnetic sensor 20 when the external magnetic field is zero has a smaller difference from the ideal value than in the case without the partial magnetic fields 40YH1 and 40YH2.

As has been described, this embodiment makes it possible to prevent the detection accuracy of the first and second magnetic sensors 10 and 20, which are the first-type magnetic sensors, from being reduced due to a hysteresis property of the detection values.

The present invention is not limited to the foregoing embodiment, and various modifications may be made thereto. The at least one first-type magnetic sensor and the soft magnetic structure of the present invention may be any ones that satisfy the requirements of the appended claims. For example, the magnetic sensor device of the present invention may be provided with a single first-type magnetic sensor and the soft magnetic structure. The soft magnetic structure is not limited to one having the function relating to the second-type magnetic sensor such as the magnetic-field conversion section 42 of the embodiment, but may be one having a different function, or may be a structure that simply satisfies the requirements of the appended claims.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A magnetic sensor device comprising:
at least one first-type magnetic sensor including at least one magnetic detection element and configured to generate a detection value corresponding to an external magnetic field; and
a soft magnetic structure formed of a soft magnetic material, wherein
the soft magnetic structure has such a magnetic property that a hysteresis loop of its magnetization with varying external magnetic field indicates a residual magnetization,
the at least one first-type magnetic sensor and the soft magnetic structure are configured so that in the presence of the residual magnetization in the soft magnetic structure, a magnetic field based on the residual magnetization is applied to the at least one first-type magnetic sensor,
the at least one first-type magnetic sensor, when used by itself, exhibits a first property such that, in a hysteresis loop of the detection value with varying external magnetic field, the detection value when the external magnetic field is zero is different from an ideal value by a first value other than zero,
the at least one first-type magnetic sensor, when used in the magnetic sensor device, exhibits a second property such that, in the hysteresis loop of the detection value with varying external magnetic field, the detection value when the external magnetic field is zero is different from the ideal value by a second value, and
the second value is smaller in absolute value than the first value.

2. The magnetic sensor device according to claim 1, wherein
the at least one first-type magnetic sensor is configured to generate a first detection value as the detection value, the first detection value corresponding to a first component of the external magnetic field, the first component being in a direction parallel to a first direction, and
the at least one first-type magnetic sensor and the soft magnetic structure are aligned in a direction intersecting the first direction.

3. The magnetic sensor device according to claim 1, wherein the magnetic field based on the residual magnetization applied to the at least one first-type magnetic sensor contains a component in a direction opposite to a direction of the residual magnetization.

4. The magnetic sensor device according to claim 1, wherein the at least one magnetic detection element includes at least one magnetic layer.

5. The magnetic sensor device according to claim 1, wherein
the at least one first-type magnetic sensor is a first magnetic sensor configured to generate a first detection value as the detection value, and a second magnetic sensor configured to generate a second detection value as the detection value
the first detection value, corresponds to a first component of the external magnetic field, the first component being in a direction parallel to a first direction,
the second detection value corresponds to a second component of the external magnetic field, the second component being in a direction parallel to a second direction,
the first direction and the second direction are orthogonal to each other,
the magnetic sensor device further comprises a support for supporting the first and second magnetic sensors and the soft magnetic structure,
the support has a reference plane parallel to the first and second directions,
the reference plane includes a first region, a second region, and a third region different from each other,
the first region is a region formed by vertically projecting the first magnetic sensor onto the reference plane,
the second region is a region formed by vertically projecting the second magnetic sensor onto the reference plane,
the third region is a region formed by vertically projecting the soft magnetic structure onto the reference plane,
at least part of the first region is located to be intersected by a first straight line and at least part of the second region is located to be intersected by a second straight line, the first straight line and the second straight line being two mutually orthogonal straight lines lying in the reference plane and passing through a centroid of the third region, and
the first straight line is parallel to the second direction.

6. The magnetic sensor device according to claim 5, wherein no portion of the first region is intersected by the second straight line, and no portion of the second region is intersected by the first straight line.

7. The magnetic sensor device according to claim 5, further comprising a second-type magnetic sensor for detecting a third component of the external magnetic field, the third component being in a direction parallel to a third direction, the third direction being orthogonal to the first direction and the second direction, wherein
the soft magnetic structure includes a magnetic-field conversion section configured to receive the third component of the external magnetic field and output an output magnetic field component, the output magnetic field component being in a direction perpendicular to the third direction,
the output magnetic field component has a strength having a correspondence with a strength of the third component of the external magnetic field, and
the second-type magnetic sensor is configured to detect the strength of the output magnetic field component.

8. The magnetic sensor device according to claim 7, wherein the soft magnetic structure further includes at least one soft magnetic layer.

9. The magnetic sensor device according to claim 7, wherein
the support includes a substrate having a top surface,
the first and second magnetic sensors, the second-type magnetic sensor, and the soft magnetic structure are disposed on or above the top surface of the substrate, and
the reference plane is the top surface of the substrate.

* * * * *